(12) United States Patent
Kang et al.

(10) Patent No.: US 10,115,726 B2
(45) Date of Patent: Oct. 30, 2018

(54) METHOD AND SYSTEM FOR FORMING MEMORY FIN PATTERNS

(71) Applicant: Tokyo Electron Limited, Minato-ku, Tokyo (JP)

(72) Inventors: Hoyoung Kang, Guilderland, NY (US); Anton J. deVilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/416,916

(22) Filed: Jan. 26, 2017

(65) Prior Publication Data
US 2017/0221902 A1    Aug. 3, 2017

Related U.S. Application Data

(60) Provisional application No. 62/288,846, filed on Jan. 29, 2016.

(51) Int. Cl.
| | |
|---|---|
| *H01L 21/311* | (2006.01) |
| *H01L 27/108* | (2006.01) |
| *H01L 21/308* | (2006.01) |
| *H01L 21/027* | (2006.01) |
| *H01L 21/8234* | (2006.01) |

(52) U.S. Cl.
CPC .... *H01L 27/10879* (2013.01); *H01L 21/0274* (2013.01); *H01L 21/3081* (2013.01); *H01L 21/3086* (2013.01); *H01L 21/3088* (2013.01); *H01L 21/823431* (2013.01)

(58) Field of Classification Search
None
See application file for complete search history.

(56) References Cited

U.S. PATENT DOCUMENTS

| | | |
|---|---|---|
| 8,368,182 B2 | 2/2013 | Lee |
| 2014/0051251 A1 | 2/2014 | Light |
| 2015/0118844 A1 | 4/2015 | Sipani |
| 2015/0243515 A1 | 8/2015 | Yuan |
| 2015/0243518 A1 | 8/2015 | Devilliers |
| 2016/0042950 A1* | 2/2016 | Dai ..................... H01L 21/0332 438/703 |
| 2017/0092496 A1* | 3/2017 | deVilliers ........... H01L 21/0337 |
| 2017/0352585 A1* | 12/2017 | Burns ............... H01L 21/76816 |

FOREIGN PATENT DOCUMENTS

KR    20100075205 B1    7/2010

OTHER PUBLICATIONS

PCT International Search Report and Written Opinion of International application No. PCT/US2017/015136, dated Apr. 21, 2017, 9 pages, Korean Intellectual Property Office, Korea.

* cited by examiner

*Primary Examiner* — Bradley K Smith

(57) ABSTRACT

Techniques disclosed herein, provide a method and fabrication structure for accurately increasing feature density for creating high-resolution features and also for cutting on pitch of sub-resolution features. Techniques include using multiple materials having different etch characteristics to selectively etch features and create cuts or blocks where specified. A multiline layer is formed of three or more different materials that provide differing etch characteristics. Etch masks, including interwoven etch masks, are used to selectively etch cuts within selected, exposed materials. Structures can then be cut and formed. Forming structures and cuts can be recorded in a memorization layer, which can also be used as an etch mask.

19 Claims, 11 Drawing Sheets

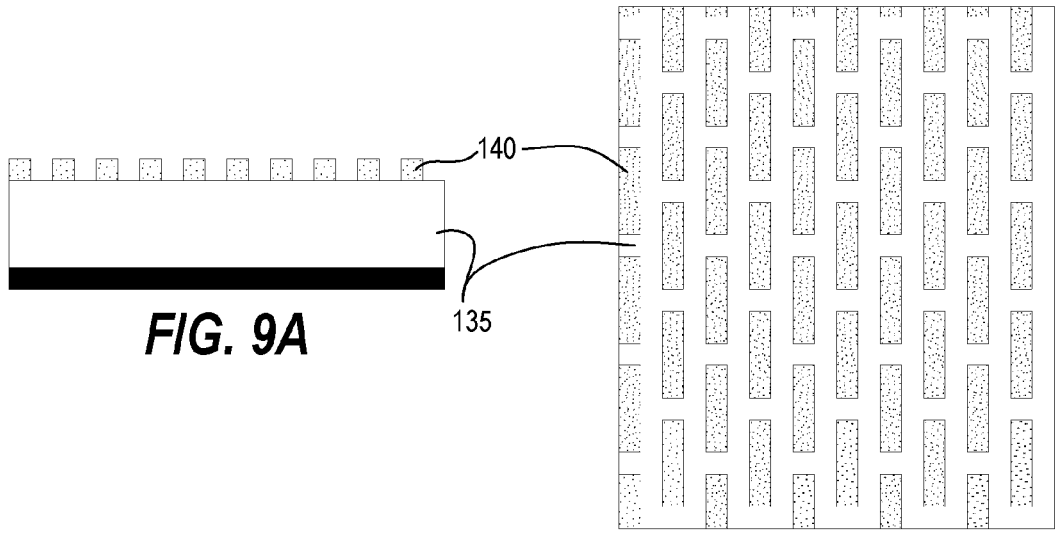
FIG. 9A
FIG. 9B
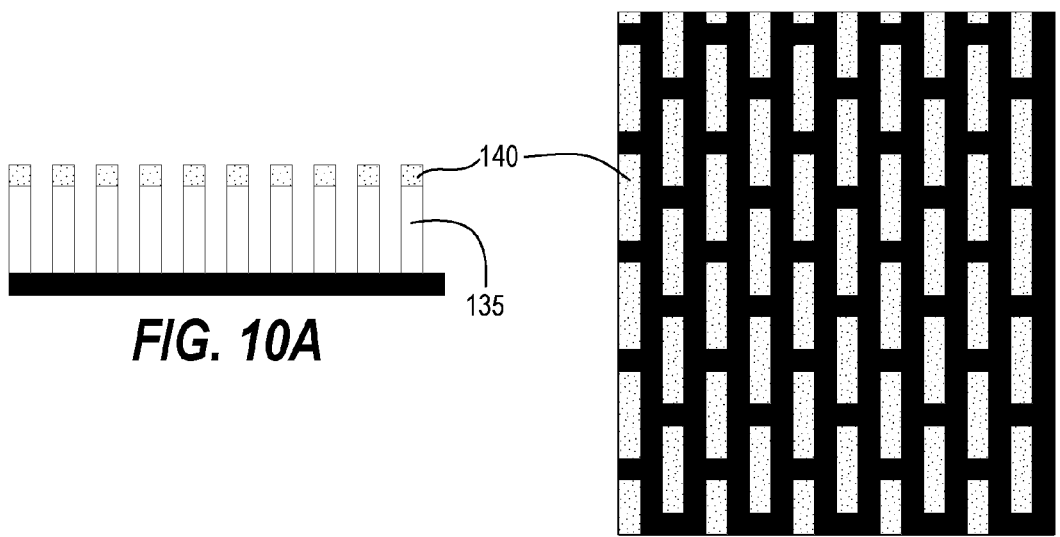
FIG. 10A
FIG. 10B
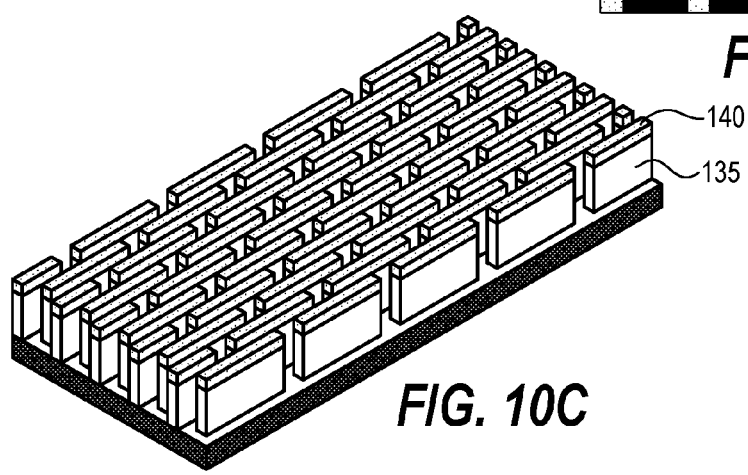
FIG. 10C

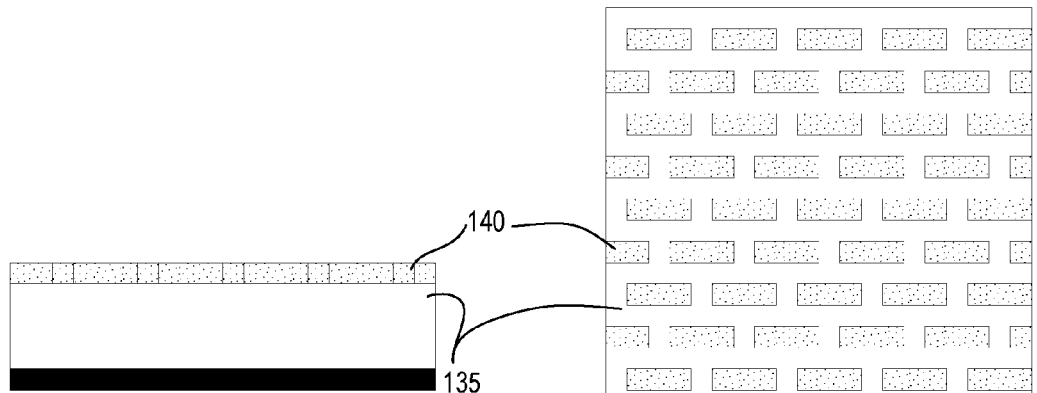
FIG. 19A
FIG. 19B
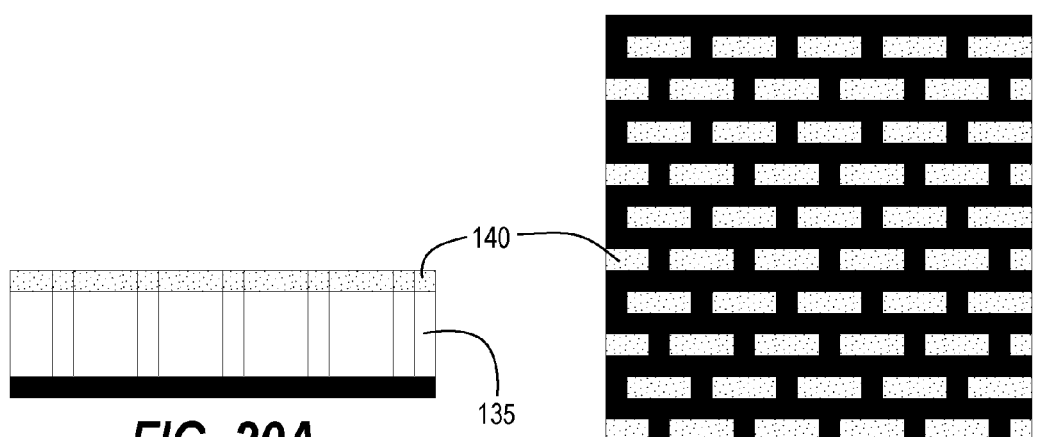
FIG. 20A
FIG. 20B

METHOD AND SYSTEM FOR FORMING MEMORY FIN PATTERNS

CROSS REFERENCE TO RELATED APPLICATIONS

The present application claims the benefit of U.S. Provisional Patent Application No. 62/288,846, filed on Jan. 29, 2016, entitled "METHOD AND SYSTEM FOR FORMING MEMORY FIN PATTERNS," which is incorporated herein by reference in its entirety.

BACKGROUND OF THE INVENTION

This disclosure relates to substrate processing, and, more particularly, to techniques for patterning substrates including patterning semiconductor wafers.

Methods of shrinking line-widths in lithographic processes have historically involved using greater-NA optics (numerical aperture), shorter exposure wavelengths, or interfacial media other than air (e.g., water immersion). As the resolution of conventional lithographic processes has approached theoretical limits, manufacturers have started to turn to double-patterning (DP) methods to overcome optical limitations.

In material processing methodologies (such as photolithography), creating patterned layers comprises the application of a thin layer of radiation-sensitive material, such as photoresist, to an upper surface of a substrate. This radiation-sensitive material is transformed into a relief pattern which can be used as an etch mask to transfer a pattern into an underlying layer on a substrate. Patterning of the radiation-sensitive material generally involves exposure of actinic radiation through a reticle (and associated optics) onto the radiation-sensitive material using, for example, a photo-lithography system. This exposure can then be followed by the removal of irradiated regions of the radiation-sensitive material (as in the case of positive photoresist), or non-irradiated regions (as in the case of negative resist) using a developing solvent. This mask layer can comprise multiple sub-layers.

Conventional lithographic techniques for exposing a pattern of radiation or light onto a substrate have various challenges that limit a size of features exposed, and limit pitch or spacing between exposed features. One conventional technique to mitigate exposure limitations is that of using a double patterning approach to allow the patterning of smaller features at a smaller pitch than what is currently possible with conventional lithographic techniques.

SUMMARY

Semiconductor technologies are continually progressing to smaller feature sizes including feature sizes of 14 nanometers, 7 nm, 5 nm, and below. This continual reduction in sizes of features from which various elements are fabricated places ever-greater demands on techniques used to form the features. The concept of "pitch" can be used to describe the sizing of these features. Pitch is the distance between the two identical points in two adjacent repetitive features. Half-pitch then is half the distance between identical features of an array.

Pitch reduction techniques, often somewhat erroneously, yet routinely, termed "pitch multiplication" as exemplified by "pitch doubling" etc., can extend the capabilities of photolithography beyond feature size limitations (optical resolution limitations). That is, conventional multiplication of pitch (more accurately pitch reduction or multiplication of pitch density) by a certain factor involves reducing a target pitch by a specified factor. Double patterning techniques used with 193 nm immersion lithography are conventionally considered as one of the most promising techniques to pattern 22 nm nodes and smaller. Noteworthy is that self-aligned double patterning (SADP) has already been established as a pitch density doubling process and has been adapted in high volume manufacturing of NAND flash memory devices. Moreover, ultra-fine resolution can be obtained to repeat the SADP step, resulting in pitch quadrupling.

Although there exist several patterning techniques to increase pattern density or pitch density, conventional patterning techniques suffer from poor resolution or rough surfaces of etched features. Thus, conventional techniques cannot provide a level of uniformity and fidelity desired for very small dimensions (20 nm and smaller). Reliable lithographic techniques can produce features having a pitch of about 80 nm. Conventional and emerging design specifications, however, desire to fabricate features having critical dimensions less than about 20 nm or 10 nm. Moreover, with pitch density doubling and quadrupling techniques, sub-resolution lines can be created, but making cuts or connections between these lines is challenging, especially since the pitch and dimensions needed for such cuts is far below capabilities of conventional photo-lithography systems.

Techniques disclosed herein provide a method for pitch reduction (increasing pitch/feature density) for creating high-resolution features and also for cutting on pitch of sub-resolution features, such as to create, for example, structures for memory arrays. Techniques herein include forming a multi-line layer of materials of different etch resistivities. Etch mask combinations can be used to make cuts first followed by creating fins, line segments, or other structures. With cuts and fins being defined by multiple different material types—instead of being defined by a photomask only—cuts can be self-aligned to fins to create fin arrays or other structural arrays that have better process margins as compared to conventional techniques for making fins.

One embodiment includes a method for patterning a substrate, such as to fabricate fins for memory arrays. A multi-line layer is formed above a memorization layer on a substrate. The multi-line layer includes a region having a pattern of alternating lines of three materials that differ chemically from each other by having different etch resistivities relative to each other. The three differing materials include material A, material B, and material C. The pattern of alternating lines of three materials includes a repeating sequence of A-B-C-B-A-B-C-B in that materials alternate in a direction parallel to a working surface of the substrate. Each line of material extends from a top surface of the multi-line layer to a bottom surface of the multi-line layer.

A first etch mask is formed above the multi-line layer. The first etch mask defines first trenches that uncover a first portion of the multi-line layer such that defined first trenches elevationally intersect multiple lines from the pattern of alternating lines. Uncovered portions of material A and portions of memorization layer directly underneath uncovered portions of material A are etched through using the first etch mask. A second etch mask is formed above the multi-line layer. The second etch mask defines second trenches that uncover a second portion of the multi-line layer such that second defined trenches elevationally intersect multiple lines from the pattern of alternating lines. Uncovered portions of material C and portions of memorization layer directly underneath uncovered portions of material C are then etched through using the second etch mask. Material B and portions of memorization layer directly underneath material B are etched through while the multi-line layer is uncovered.

Accordingly, fins can be created with cuts that are self-aligned and not dependent on accurate photolithographic registration. Instead of relying on photolithographic alignment, cut placement can be based on deposited material thicknesses and differential etch resistivities.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

FIGS. 1A-10A are cross-sectional schematic views of an example substrate segment showing a process flow according to embodiments disclosed herein.

FIGS. 1B-10B are schematic top views of an example substrate segment showing a process flow according to embodiments disclosed herein.

FIG. 10C is an example perspective view of an example substrate segment showing a process flow according to embodiments disclosed herein.

FIGS. 11A-20A are cross-sectional schematic views of an example substrate segment showing a process flow according to embodiments disclosed herein.

FIGS. 11B-20B are schematic top views of an example substrate segment showing a process flow according to embodiments disclosed herein.

DETAILED DESCRIPTION

Techniques disclosed herein, provide a method and fabrication structure for accurately increasing feature density for creating high-resolution features and also for cutting on pitch of sub-resolution features. Techniques include using multiple materials having different etch characteristics to selectively etch features and create cuts or blocks where specified. In general, a multiline layer is formed of three or more different materials that provide differing etch characteristics. Then etch masks can be used, including interwoven etch masks, to selectively etch cuts within selected, exposed materials. Structures can then be cut and formed. Forming structures and cuts can be recorded in a memorization layer, which (when component patterns have been recorded) can be used as an etch mask for forming structures in an underlying layer.

There are various types of structures that can be formed with techniques herein. For convenience in describing embodiments, focus will primarily be in describing forming memory fin patterns or fin arrays. Techniques herein, for example, can enable creating DRAM (dynamic random-access memory) fin patterns with better process margins. In DRAM fin patterning, line cutting is extremely challenging. For example, with progression of feature scaling or size reduction, lines for such fin patterns are being formed at sub-resolution dimensions, such as by using self-aligned quad patterning techniques to form mandrels and lines. In a conventional fin fabrication flow, fins or lines are formed in a memorization layer, such as a hardmask layer. This hardmask layer is then planarized with one or more materials, and then an etch mask is formed on top by photolithographic patterning techniques. After developing a photoresist layer exposed to a photomask of cuts, the result is that the photoresist layer looks like an array of relatively small holes. These holes are designed to align directly over sub-resolution formed lines to make cuts in these lines as that pattern is transferred (etched) through several layers to cut buried lines in the hardmask layer at specified locations. The challenge is that with overlay or photolithographic misalignment, the lines can be only partially cut or not cut at all if a cut lands between two adjacent lines, which leads to or causes device failure. For sub-resolution cuts, there may be two different cut masks to cut the buried lines at desired locations.

Figure 1A:
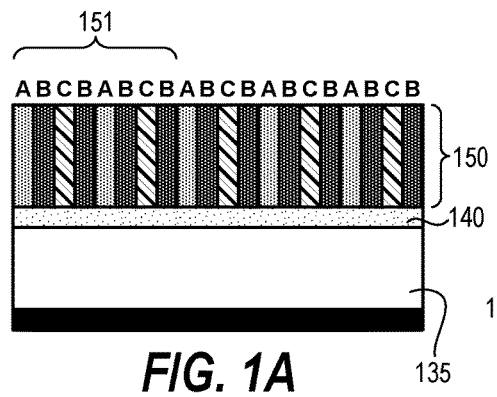
Figure 1B:
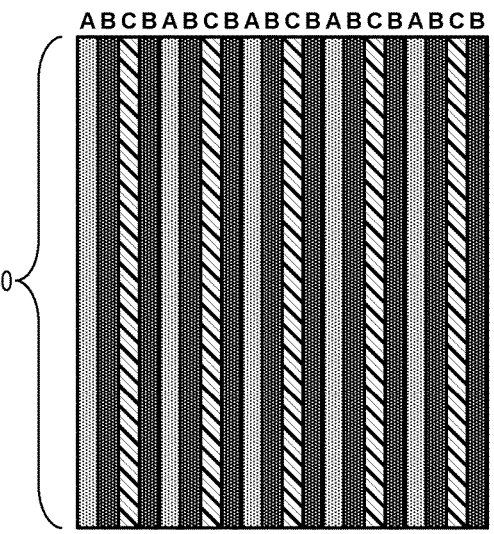

Accordingly, embodiments herein can be used for patterning a substrate. This can include making a composite etch mask for transferring sub-resolution patterns, such as a fin array. Referring now to FIGS. 1A and 1B, a multi-line layer 150 is formed above a memorization layer 140 on a substrate. Underlying layer 135 can be positioned under memorization layer 140. Note that this substrate stack can include additional intermediate layers or films to assist with fabrication. FIG. 1A shows a side cross-sectional view of an example substrate segment, while FIG. 1B shows a top view of the corresponding substrate segment. Note that this figure numbering repeats for subsequent figures herein in that figure numbers with a letter "A" designate side views while figure numbers with a letter "B" designate top views. The multi-line layer 150 includes a region having a pattern of alternating lines of three or more materials that differ chemically from each other by having different etch resistivities relative to each other. The three differing materials include material A, material B, and material C. One or more lines of the multi-line layer can be formed by self-aligned double patterning or self-aligned quadruple patterning or other pitch multiplication techniques.

The pattern of alternating lines of three materials includes a repeating sequence of A-B-C-B-A-B-C-B in that materials alternate in a direction parallel to a working surface of the substrate. In other words, the pattern of alternating lines of three materials alternates horizontally across a substrate, assuming that a working surface of the substrate is oriented horizontally. Bracket 151 shows an example repeating sequence. In one embodiment, a shortest segment of the repeating pattern is A-B-C-B, which then repeats. FIGS. 1A and 1B show letters A, B, and C above each line or material type. Each line of material extends from a top surface of the multi-line layer to a bottom surface of the multi-line layer. In other words, each line of material is accessible to etchants from above, and can be etched completely through multi-line layer 150 to access the memorization layer 140 and any intervening films.

Having different etch resistivities from each other, as used herein, means that there is at least one etchant (or etchant combination) that etches a given one material at a greater rate than the other material(s). Note that there can exist particular etchants that etch two or more given materials at a same rate, but there is at least one etchant that etches an included material faster relative to the other material(s). Etching one material relative to another can include etching one material without substantially etching the other, or etching one material at a substantially greater rate as compared to the other material such as having an etch rate ratio of 3:1, 4:1, 10:1, etc. For two materials to have different etch resistivities this typically means that two materials are chemically different from each other such as by particular atomic elements included. Two materials that are largely the same, except that one of the two materials includes a dopant, can nevertheless have different etch resistivities. Moreover, materials having the same atomic elements but with differing molecular or crystal structures can provide an etch resistivity differential also.

Figure 2A:
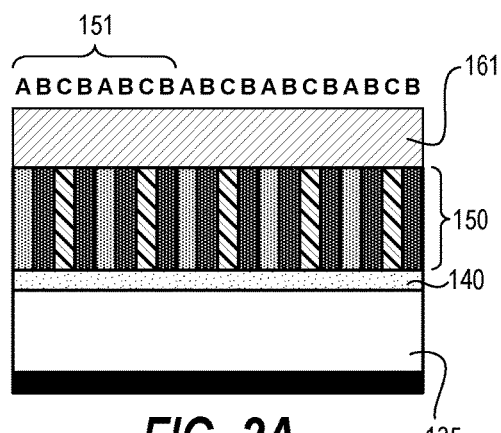
Figure 2B:
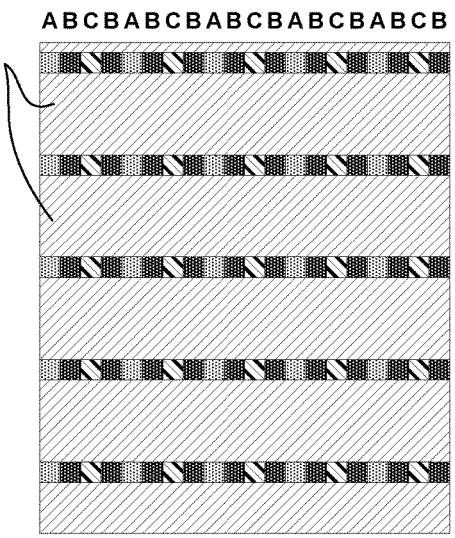

Referring now to FIGS. 2A and 2B, a first etch mask 161 is formed above the multi-line layer 150. The first etch mask defines first trenches that uncover a first portion of the multi-line layer such that defined first trenches elevationally intersect multiple lines from the pattern of alternating lines. In other words, trenches defined by the first etch mask 161 cross over the underlying pattern of alternating lines, such as from a viewpoint of a directional etch or normal to the working surface of the substrate. In FIG. 2B it is possible to see (looking between the defined trenches) line segments and the repeating pattern. Note that the intersection or crossing of lines does not need to be perpendicular, but can cross at acute/oblique angles also. Note that for convenience of explanation, first etch mask 161 is illustrated as a single layer positioned directly on multi-line layer 150. First etch mask 161 can be formed via conventional photolithographic techniques, which can include first depositing a planarization layer on the substrate, then an anti-reflective coating, and then a layer of radiation-sensitive material, such as photoresist, then exposure, and development of portions that are soluble or have become soluble. In alternative embodiments, a hardmask layer can be deposited on multi-line layer 150 prior to the planarization layer, or deposited on the planarization layer. Having a hardmask layer deposited above the multi-line layer 150 and below the first etch mask 161 can be beneficial in some process flows.

Figure 3A:
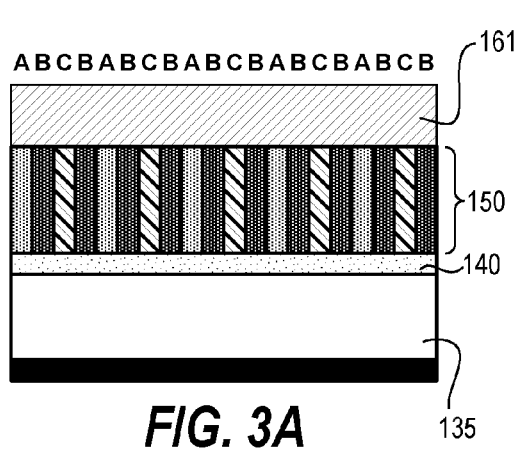
Figure 3B:
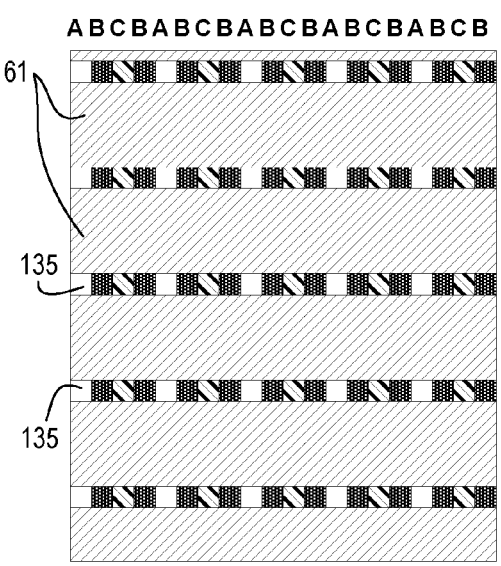
Figure 3C:
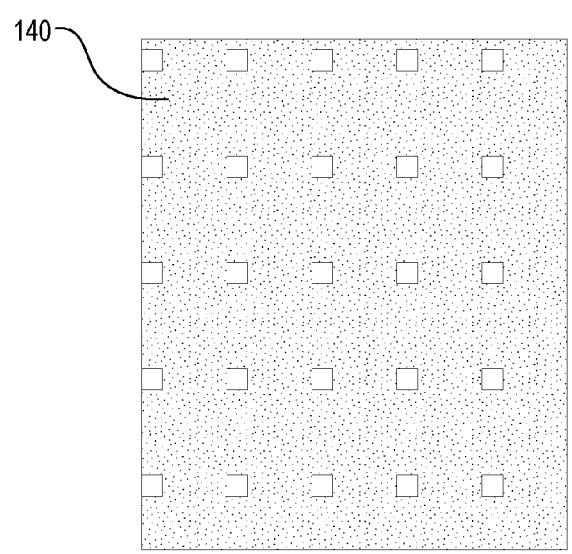
FIGS. 3C and 6C are cross-sectional top views of an example substrate segment showing a process flow according to embodiments disclosed herein.

Referring now to FIGS. 3A and 3B, an etching operation is executed that etches through uncovered portions of material A and then uncovered portions of memorization layer 140 directly underneath uncovered portions of material A using the first etch mask 161. If a hardmask has been deposited on multi-line layer 150, then the hardmask is etched through corresponding to the first etch mask 161. In FIG. 3B, material A is no longer visible through the trenches, but portions of underlying layer 135 are now visible. For better understanding, FIG. 3C shows a top view of what memorization layer 140 looks like at this stage in the process if overlying layers were removed from memorization layer 140.

Figure 4A:
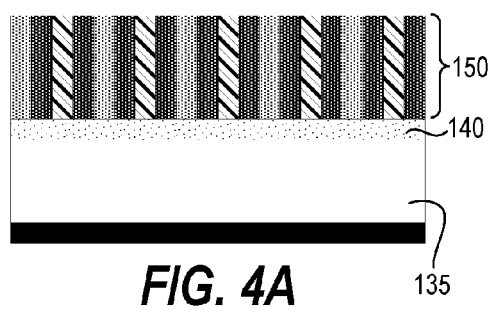
Figure 4B:
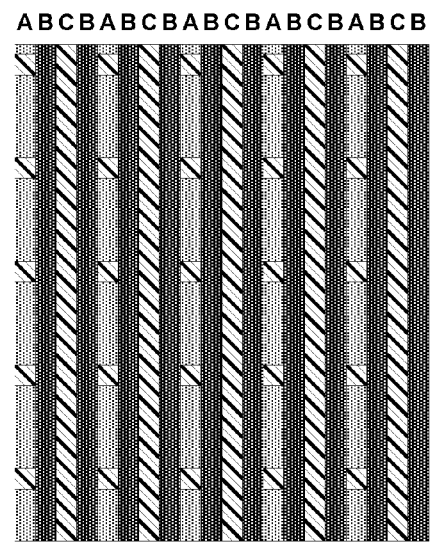

Referring now to FIGS. 4A and 4B, spaces in multi-line layer 150 and memorization layer 140 are then filled with a particular material. For example, material C can be deposited on the substrate to fill openings. Such a fill could initially result in an overburden of material C, and then the substrate can be planarized back to a top of the multi-line layer 150, as shown in FIG. 4B. Prior to such a fill, the first etch mask 161, and accompanying layers, can be removed. If a hardmask layer is incorporated on top of the multi-line layer 150, this hardmask layer can remain on the substrate. Note also that planarizing back to a top surface of multi-line layer 150 is not needed. Instead, one option, is to use the fill layer of material C (or other material) as a planarization layer for depositing a subsequent etch mask.

Figure 5A:
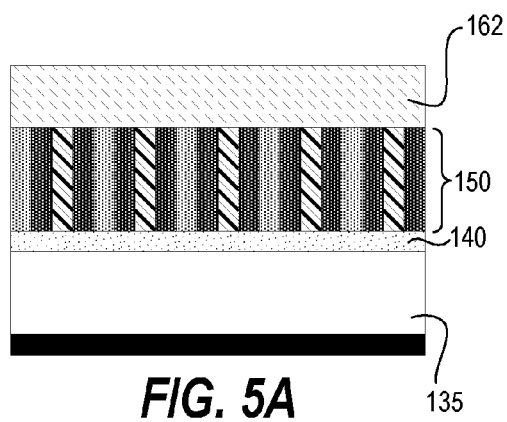
Figure 5B:
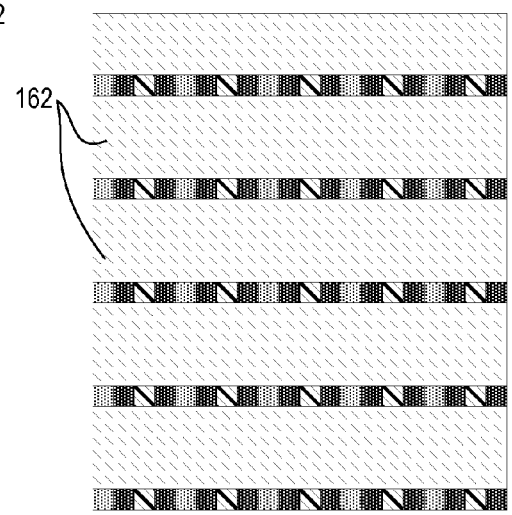

Referring now to FIGS. 5A and 5B, a second etch mask 162 is formed above the multi-line layer 150. The second etch mask defines second trenches that uncover a second portion of the multi-line layer such that defined second trenches elevationally intersect multiple lines from the pattern of alternating lines. In FIG. 5B, between the defined second trenches it is possible to see line segments and the repeating pattern. Second etch mask 162 can be formed via conventional photolithographic techniques, which can include first depositing a planarization layer on the substrate, then an anti-reflective coating, and then a layer of photoresist. Note that second etch mask 162 is similar to first etch mask 161, except that trench locations are shifted to be positioned in between positions of trenches from the first etch mask 161.

Figure 6A:
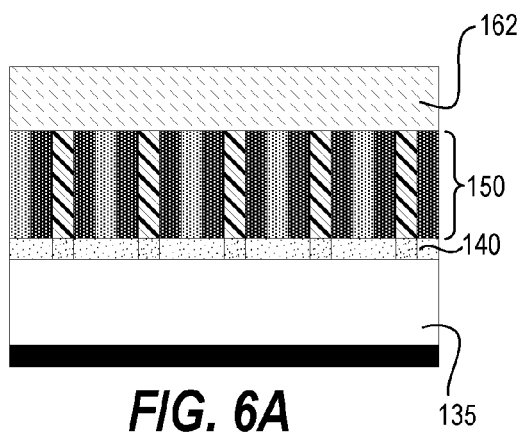
Figure 6B:
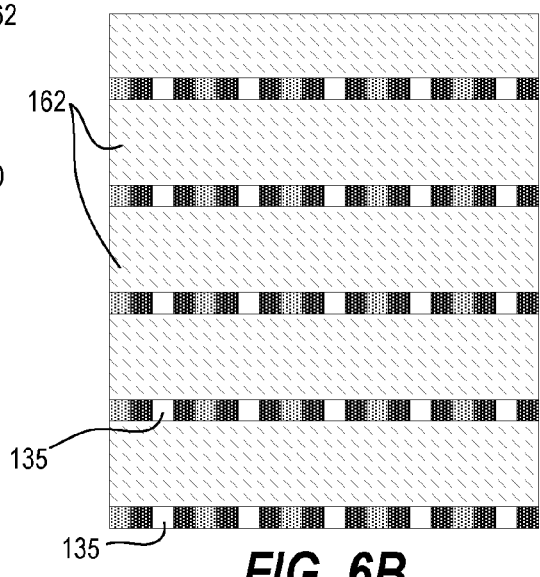
Figure 6C:
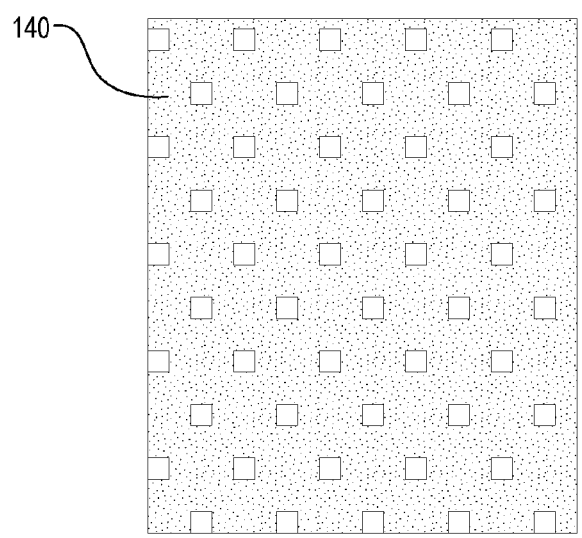

Referring now to FIGS. 6A and 6B, an etching operation is executed that etches through uncovered portions of material C and then uncovered portions of memorization layer 140 directly underneath uncovered portions of material C using the second etch mask 162. If a hardmask layer is used above multi-line layer 150, then the hardmask layer is etched through corresponding to the second etch mask 162. In FIG. 6B, material C is no longer visible between the trenches, but portions of underlying layer 135 are now visible. For better visualization, FIG. 6C shows a top view of what memorization layer 140 looks like at this stage in the process if overlying layers were removed from memorization layer 140.

Figure 7A:
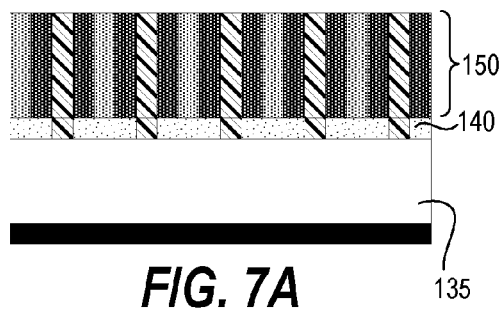
Figure 7B:
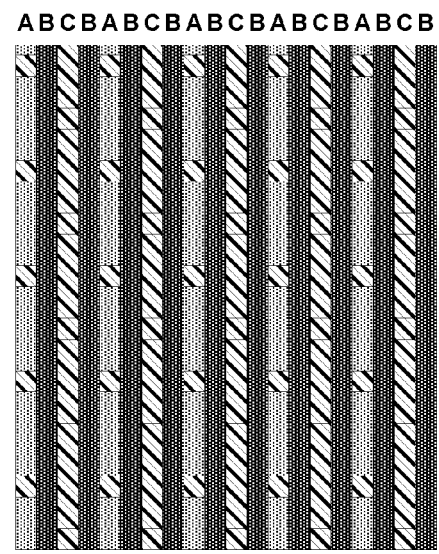

At this point, second etch mask 162 (and associated layers) can be removed. Referring now to FIGS. 7A and 7B, spaces in multi-line layer 150 and memorization layer 140 are then filled with a particular material. For example, material C can be deposited on the substrate to fill these openings. Such a fill could initially result in an overburden of material C. This overburden can be removed as the substrate is planarized back to a top of the multi-line layer 150, as shown in FIG. 7B. If a hardmask layer is optionally incorporated on top of the multi-line layer 150, then this hardmask layer is removed either before or after filling spaces and planarizing down to a top surface of multi-line layer 150 so that all of material B (lines of material B) is uncovered.

Figure 8A:
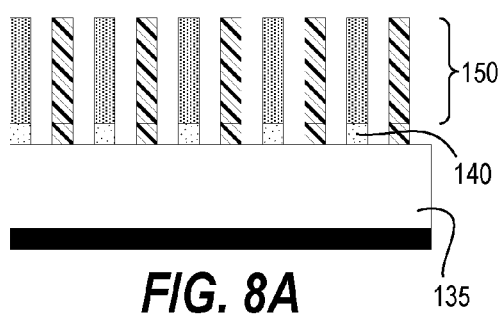
Figure 8B:
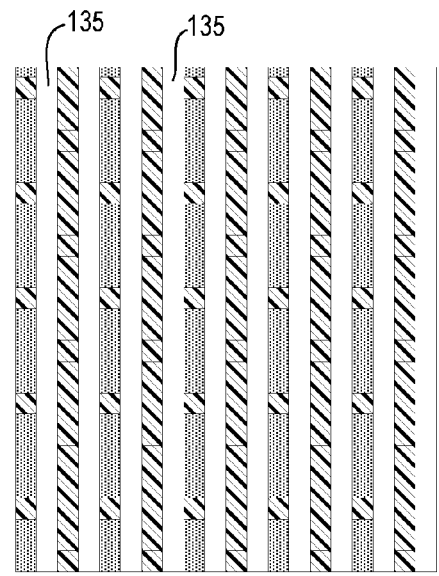
Figure 11A:
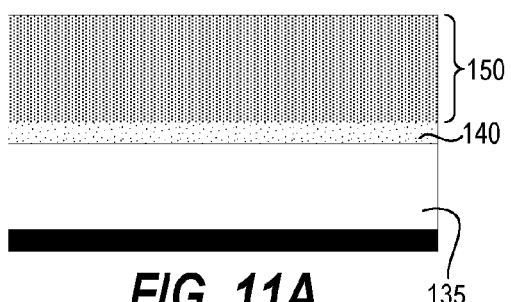
Figure 11B:
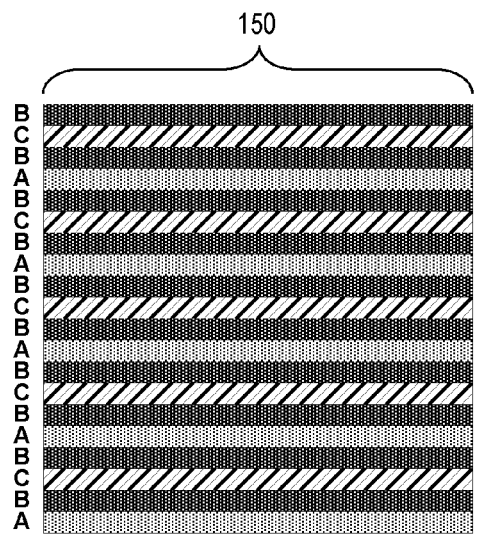

Referring now to FIGS. 8A and 8B, an etching operation is executed that etches through uncovered portions of material B and then uncovered portions of memorization layer 140 directly underneath uncovered portions of material B. Note that a separate etch mask is not needed for etching material B. Instead, materials A and C (and material used to fill spaces) function as an etch mask having different etch resistivities to a particular etchant as compared to material B. In FIG. 8B, material B is no longer visible and trenches have been etched into memorization layer 140 so that portions of underlying layer 135 are now visible.

Referring now to FIGS. 9A and 9B, remaining materials above the memorization layer can be removed after completing etch transfers based on etching through material A, material B, and material C. The memorization layer results in a relief pattern having an array of parallel line segments. In some embodiments, parallel line segments of the array of line segments have a pitch less than 40 nanometers. For example, a pitch between adjacent lines of material B is less than 40 nanometers, and a pitch between adjacent lines of material A and material C is less than 40 nanometers. The memorization layer 140 (which can be comprised of hardmask material, such as titanium nitride) can then be used as an etch mask for transferring the pattern of line segments into underlying layer 135 to create an array of fins, as shown in FIGS. 10A and 10B. FIG. 10C is a perspective view of the substrate segment showing fabricated line segments with memorization layer 140 still on the substrate. Additional processing can include removing the memorization layer 140, and/or further blocking, cutting, doping, etc.

Note that in this embodiment, cuts are created prior to creating lines to be cut. For example, etching through material B occurs subsequent to etching through material A and etching through material C. Thus, cuts (removed material) from the memorization layer 140 can be created prior to creating lines in the memorization layer 140 to be cut. In other embodiments, however, etching through material B can occur prior to etching through material A and etching through material C.

FIGS. 11-20 illustrate another example process flow that uses bilayer mandrels for forming etch masks to access the multi-line layer. FIGS. 11A and 11B are similar to FIGS. 1A and 1B, with a difference that the substrate segment has been rotated 90 degrees to better depict cross sections of masking layers above multi-line layer 150.

Figure 12A:
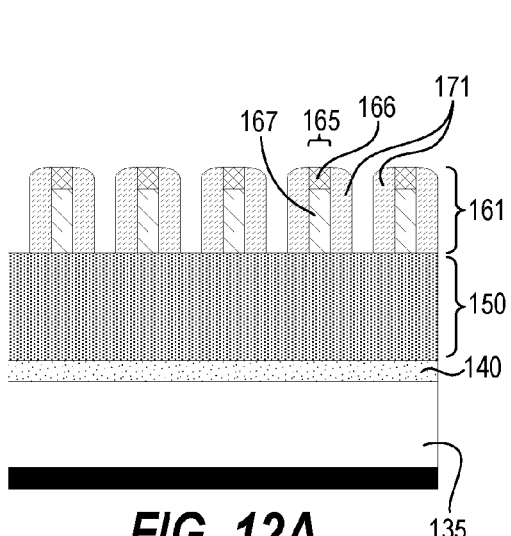
Figure 12B:
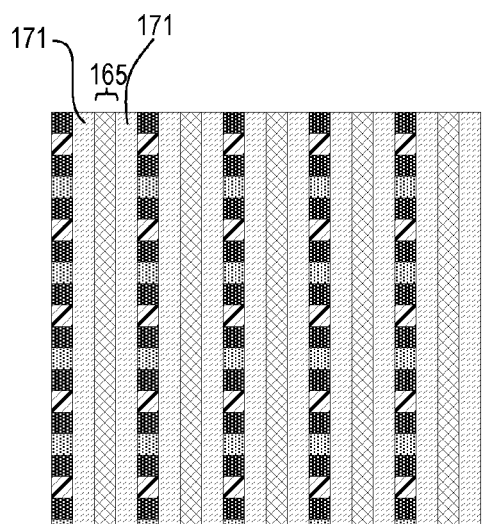

Referring now to FIGS. 12A and 12B, forming the first etch mask 161 includes forming bilayer mandrels 165 that have an upper material 166 and a lower material 167. The upper material 166 has a different etch resistivity as compared to the lower material 167. Sidewall spacers 171 are formed on the bilayer mandrels. FIG. 12A shows sidewall spacers 171 in a formed state, but forming can involve depositing a conformal film over the bilayer mandrels, and then executing a spacer open etch to remove conformal material from over the bilayer mandrel and over the multi-line layer 150 between sidewall spacers 171. First etch mask 161 includes multiple bilayer mandrels 165 and sidewall spacers 171 defining trenches between exposed sidewalls of adjacent sidewall spacers.

Figure 13A:
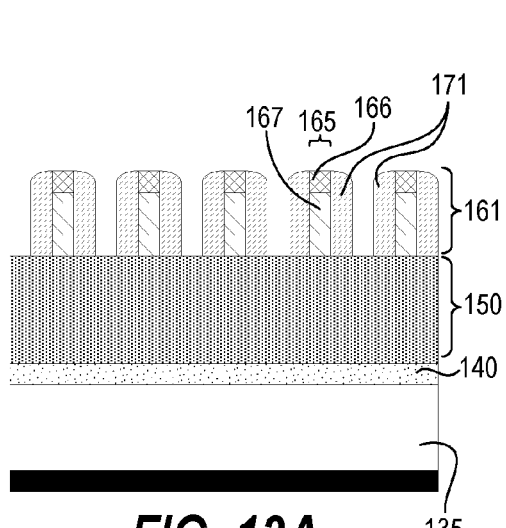
Figure 13B:
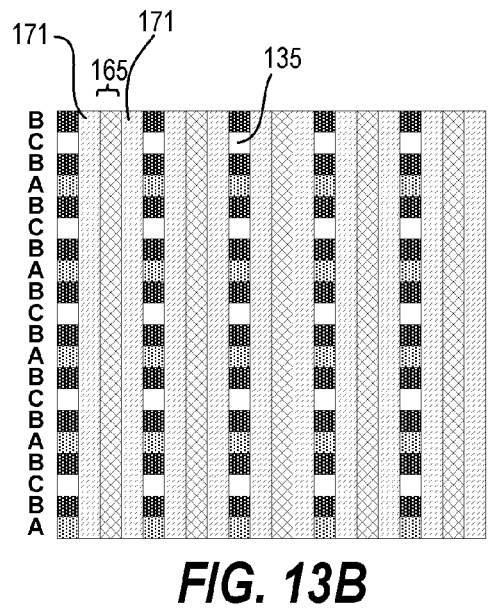
Figure 14A:
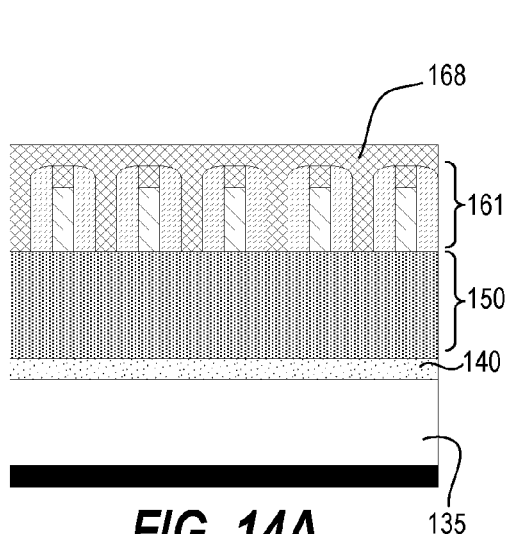
Figure 14B:
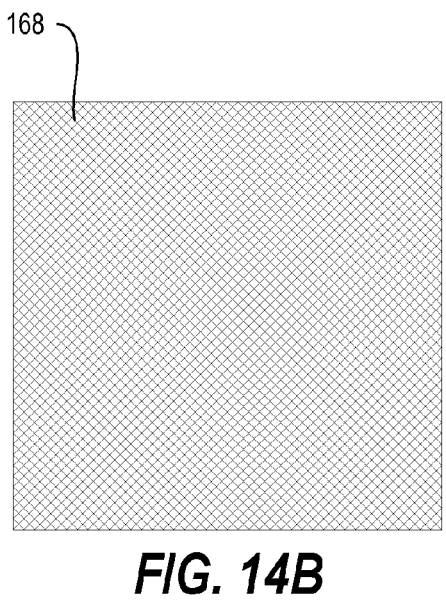
Figure 15A:
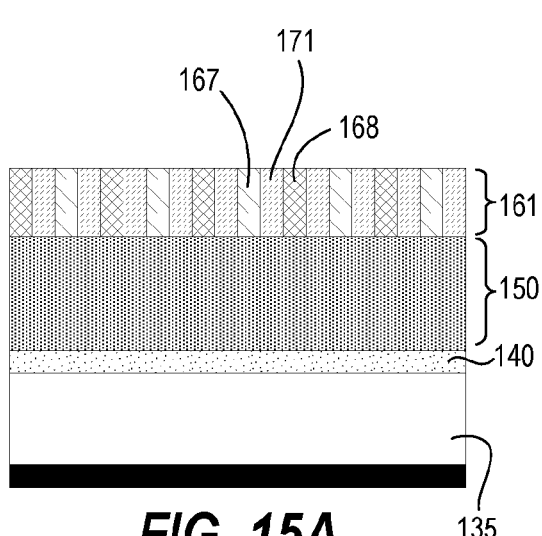
Figure 15B:
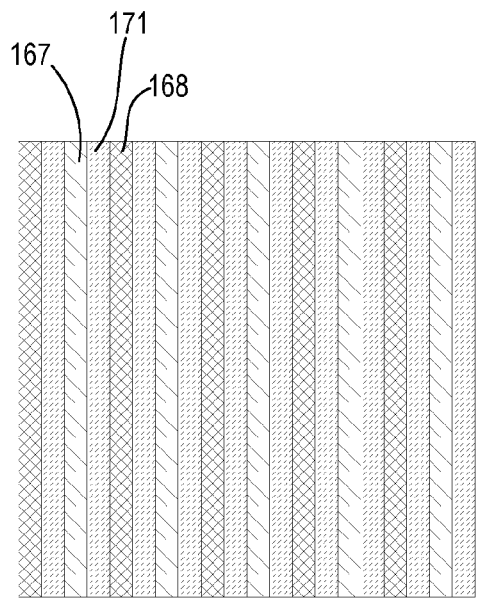

FIGS. 13A and 13B are similar to FIGS. 3A and 3B. An etching operation is executed that etches through uncovered portions of material C and then uncovered portions of memorization layer 140 directly underneath uncovered portions of material C using the first etch mask 161. After this etching operation, a fill layer 168 is deposited on the substrate as shown in FIGS. 14A and 14B. This includes filling defined trenches between adjacent sidewall spacers of the first etch mask. Fill layer 168 can be a same material as upper material 166. The substrate is then planarized down to an upper surface of lower material 167 of the bilayer mandrels 165. Thus, the lower portion of the bilayer mandrels 165 can function as a planarization stop material such as with chemical mechanical polishing. A result of such a planarization step is shown in FIGS. 15A and 15B.

Figure 16A:
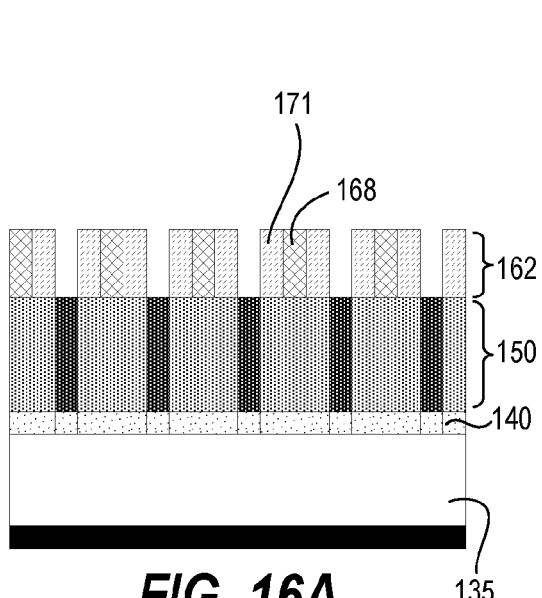
Figure 16B:
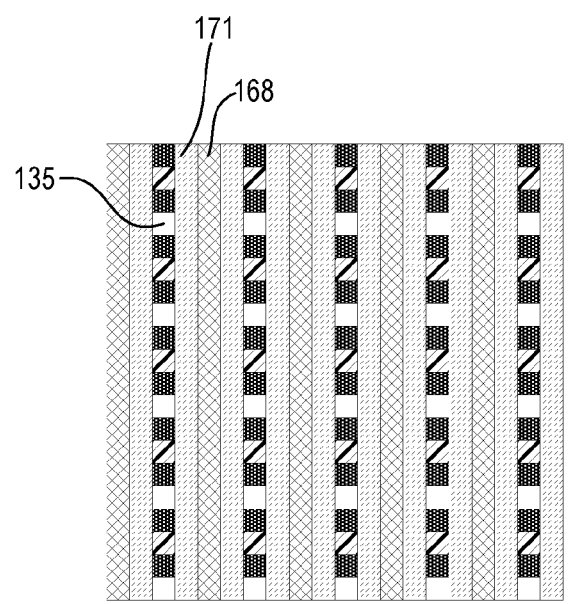

With the lower material 167 of the bilayer mandrels 165 exposed, the bilayer mandrels 165 can be completely removed to result in a second etch mask 162, as shown in FIG. 16A. The second etch mask defines second trenches that uncover a second portion of the multi-line layer such that defined second trenches elevationally intersect multiple lines from the pattern of alternating lines. An etching operation is executed that etches through uncovered portions of material A and then uncovered portions of memorization layer 140 directly underneath uncovered portions of material A using the second etch mask 162. A result of such etch transfer is shown in FIGS. 16A and 16B as underlying layer 135 is now visible from the top view in FIG. 16B.

Figure 17A:
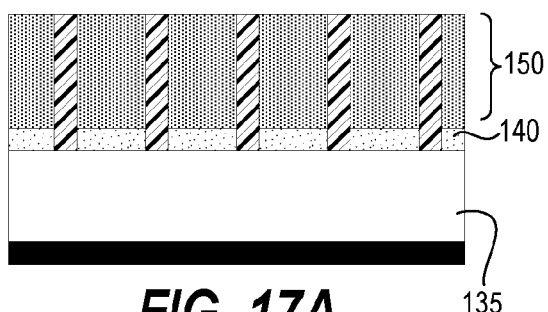
Figure 17B:
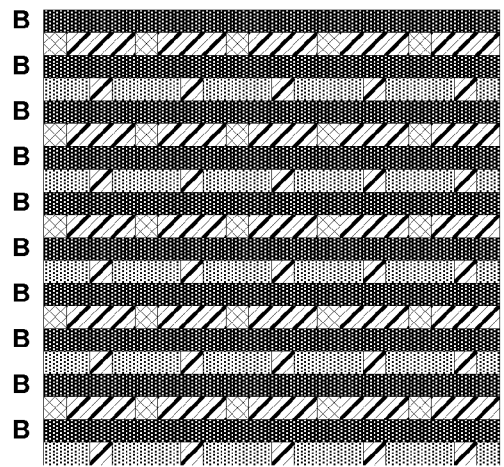

Second etch mask 162 (and associated films) can be removed. Referring now to FIGS. 17A and 17B, spaces in multi-line layer 150 and memorization layer 140 can be filled with a particular material. For example, material C can be deposited on the substrate to fill openings. Such a fill could initially result in an overburden of material C, and then the substrate can be planarized back to a top of the multi-line layer 150, as shown in FIG. 17B. If a hardmask layer is incorporated on top of the multi-line layer 150, then this hardmask layer can be removed either before or after filling spaces and planarizing down to a top surface of multi-line layer 150 so that all of material B (lines of material B) is uncovered.

Figure 18A:
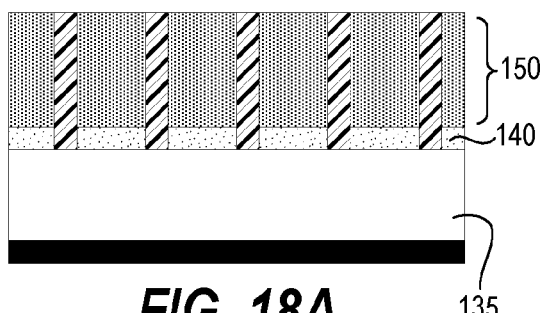
Figure 18B:
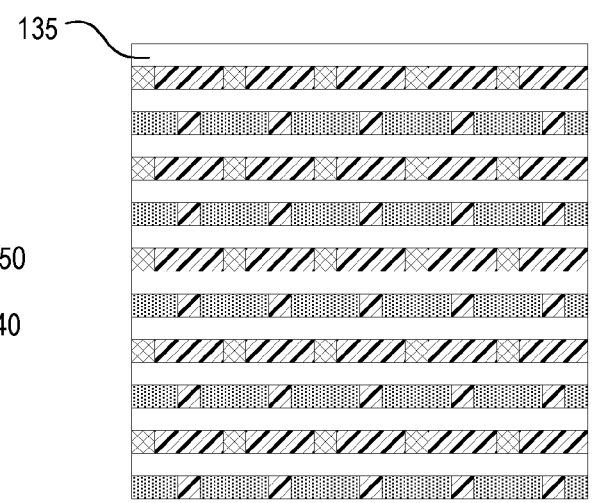

Referring now to FIGS. 18A and 18B, an etching operation is executed that etches through uncovered portions of material B and then uncovered portions of memorization layer 140 directly underneath uncovered portions of material B. Note that a separate etch mask is not needed for etching material B. Instead, materials A and C and filler materials function as an etch mask having different etch resistivities to a particular etchant as compared to material B. In FIG. 18B, material B is no longer visible and trenches have been etched into memorization layer 140 so that portions of underlying layer 135 are now visible.

Referring now to FIGS. 19A and 19B, remaining materials above the memorization layer 140 can be removed after completing etch transfers based on etching through material A, material B, and material C, the memorization layer resulting in a relief pattern having an array of parallel line segments. The memorization layer 140 (which can be comprised of hardmask material or metal hardmask material) can then be used as an etch mask for transferring the pattern of line segments into underlying layer 135 to create an array of fins, as shown in FIGS. 20A and 20B. Additional processing can include removing the memorization layer 140, further blocking, cutting, doping, etc.

The multi-line layer 150 can be formed with various techniques. One technique is similar to how second etch mask 162 of FIG. 15A is formed. For example, forming the multi-line layer can include forming mandrels using material A. Mandrels can be a result of self-aligned quad patterning or other pitch multiplication patterning. Sidewall spacers are then formed on sidewalls of mandrels using material B. Then fill structures are formed using material C, with the fill structures filling trenches between adjacent spacers. Accordingly, an alternating pattern of lines of differing materials is created in which each material can be selectively accessed for etching with respect to the other materials.

In another embodiment, a method of patterning a mask includes forming a multi-line layer above a memorization layer on a substrate. The multi-line layer includes a region having a pattern of alternating lines of three materials that differ chemically from each other by having different etch resistivities relative to each other. Note that it is not required that the entire multi-line layer have the pattern of alternating lines, but at least a portion. The alternating lines includes mandrels, sidewall spacers, and fill structures. The pattern of alternating lines of three materials includes alternating lines of mandrels and lines of fill structures with sidewall spacers positioned between lines of mandrels and lines of fill structures with each line of material extending from a top surface of the multi-line layer to a bottom surface of the multi-line layer.

A first etch mask is formed above the multi-line layer. The first etch mask defines first trenches that uncover a first portion of the multi-line layer such that defined first trenches elevationally intersect (cross over) multiple lines from the pattern of alternating lines. An etching operation is executed that etches through uncovered portions of mandrels and portions of memorization layer directly underneath uncovered portions of mandrels using the first etch mask.

A second etch mask is formed above the multi-line layer. The second etch mask defines second trenches that uncover a second portion of the multi-line layer such that second defined trenches elevationally intersect multiple lines from the pattern of alternating lines. Another etching operation is executed that etches through uncovered portions of fill structures and portions of memorization layer directly underneath uncovered portions of fill structures using the second etch mask. The multi-line layer is then uncovered and sidewall spacers and portions of memorization layer directly underneath sidewall spacers are etched away to transfer this pattern into the memorization layer, thereby creating an array of line segments in the memorization layer that are self-aligned.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for patterning a substrate, the method comprising:
    forming a multi-line layer above a memorization layer on a substrate, the multi-line layer including a region having a pattern of alternating lines of three materials that differ chemically from each other by having different etch resistivities relative to each other, the three materials include material A, material B, and material C, the pattern of alternating lines of three materials includes a repeating sequence of A-B-C-B-A-B-C-B in that materials alternate in a direction parallel to a working surface of the substrate, each line of material extending from a top surface of the multi-line layer to a bottom surface of the multi-line layer;
    forming a first etch mask above the multi-line layer, the first etch mask defining first trenches that uncover a first portion of the multi-line layer such that defined first trenches elevationally intersect multiple lines from the pattern of alternating lines;
    etching through uncovered portions of material A and portions of the memorization layer directly underneath the uncovered portions of material A using the first etch mask;
    forming a second etch mask above the multi-line layer, the second etch mask defining second trenches that uncover a second portion of the multi-line layer such that defined second trenches elevationally intersect multiple lines from the pattern of alternating lines;
    etching through uncovered portions of material C and portions of the memorization layer directly underneath the uncovered portions of material C using the second etch mask; and
    etching through material B and portions of the memorization layer directly underneath material B while the multi-line layer is uncovered.

2. The method of claim 1, further comprising:
    removing remaining materials above the memorization layer after completing etch transfers based on etching through material A, material B, and material C, the memorization layer resulting in a relief pattern having an array of parallel line segments.

3. The method of claim 2, wherein parallel line segments of the array of parallel line segments have a pitch less than 40 nanometers.

4. The method of claim 2, wherein line cuts are created in the memorization layer prior to creating lines in the memorization layer, and wherein the memorization layer comprises a hardmask material.

5. The method of claim 2, wherein one or more lines of the multi-line layer are formed by self-aligned double patterning or self-aligned quadruple patterning.

6. The method of claim 2, further comprising:
    transferring the relief pattern having the array of parallel line segments into an underlying layer such that an array of fins are created in the underlying layer.

7. The method of claim 1, wherein etching through material B occurs subsequent to etching through material A and etching through material C.

8. The method of claim 1, wherein etching through material B occurs prior to etching through material A and etching through material C.

9. The method of claim 1, further comprising forming a hardmask layer above the multi-line layer prior to forming the first etch mask and forming the second etch mask; and;
etching through corresponding portions of the hardmask layer using the first etch mask and the second etch mask.

10. The method of claim 1, wherein forming the first etch mask includes depositing a radiation-sensitive material on the substrate, and developing the radiation-sensitive material after photolithographic exposure.

11. The method of claim 10, wherein forming the second etch mask includes depositing a second radiation-sensitive material on the substrate, and developing the second radiation-sensitive material after photolithographic exposure; and
further comprising, prior to depositing the second radiation-sensitive material, and subsequent to etching through the uncovered portions of material A and portions of the memorization layer directly underneath the uncovered portions of material A, filling openings in the memorization layer and in the multi-line layer with material C.

12. The method of claim 11, further comprising, prior to etching through material B and portions of the memorization layer directly underneath material B, filling openings in the memorization layer and in the multi-line layer.

13. The method of claim 1, wherein forming the first etch mask includes:
forming bilayer mandrels that have an upper material and a lower material, the upper material having a different etch resistivity as compared to the lower material;
forming sidewall spacers on the bilayer mandrels, an array of the bilayer mandrels and the sidewall spacers defining trenches between exposed sidewalls of adjacent sidewall spacers.

14. The method of claim 13, wherein forming the second etch mask includes:
filling the defined trenches between the adjacent sidewall spacers of the first etch mask;
removing the upper material of the bilayer mandrels such that the lower material is uncovered; and
removing the lower material of the bilayer mandrels.

15. The method of claim 1, wherein forming the multi-line layer above the memorization layer includes:
forming mandrels using material A;
forming sidewall spacers on sidewalls of mandrels using material B; and
forming fill structures using material C, the fill structures filling trenches between adjacent spacers.

16. The method of claim 15, wherein a first pitch between lines of material B is less than 40 nanometers, and wherein a second pitch between the mandrels and the fill structures is less than 40 nanometers.

17. The method of claim 1, wherein material A is mandrel material, material B is spacer material, and material C is filler material.

18. A method for patterning a substrate, the method comprising:
forming a multi-line layer above a memorization layer on a substrate, the multi-line layer including a region having a pattern of alternating lines of three materials that differ chemically from each other by having different etch resistivities relative to each other, alternating lines includes mandrels, sidewall spacers, and fill structures, the pattern of alternating lines of three materials includes alternating lines of the mandrels and lines of the fill structures with the sidewall spacers positioned between lines of the mandrels and lines of the fill structures, each line of material extending from a top surface of the multi-line layer to a bottom surface of the multi-line layer;
forming a first etch mask above the multi-line layer, the first etch mask defining first trenches that uncover a first portion of the multi-line layer such that defined first trenches elevationally intersect multiple lines from the pattern of alternating lines;
etching through uncovered portions of mandrels and portions of the memorization layer directly underneath the uncovered portions of mandrels using the first etch mask;
forming a second etch mask above the multi-line layer, the second etch mask defining second trenches that uncover a second portion of the multi-line layer such that second defined trenches elevationally intersect multiple lines from the pattern of alternating lines;
etching through uncovered portions of the fill structures and portions of the memorization layer directly underneath the uncovered portions of the fill structures using the second etch mask; and
etching through the sidewall spacers and portions of the memorization layer directly underneath the sidewall spacers with the multi-line layer uncovered.

19. The method of claim 18, further comprising:
removing remaining materials above the memorization layer after completing etch transfers based on etching through the mandrels, the fill structures, and the sidewall spacers, the memorization layer being a relief pattern having an array of parallel line segments; and
transferring the relief pattern having the array of parallel line segments into an underlying layer such that an array of fins is created in the underlying layer.

* * * * *